US009590385B2

(12) United States Patent
Maryfield et al.

(10) Patent No.: US 9,590,385 B2
(45) Date of Patent: Mar. 7, 2017

(54) COMPACT LASER SOURCE

(71) Applicant: Cubic Corporation, San Diego, CA (US)

(72) Inventors: Tony Maryfield, Poway, CA (US); Anand Hariharan, Franklin Park, NJ (US); David Robinson, San Diego, CA (US)

(73) Assignee: Cubic Corporation, San Diego, CA (US)

( * ) Notice: Subject to any disclaimer, the term of this patent is extended or adjusted under 35 U.S.C. 154(b) by 673 days.

(21) Appl. No.: 13/945,537

(22) Filed: Jul. 18, 2013

(65) Prior Publication Data

US 2016/0301183 A1    Oct. 13, 2016

Related U.S. Application Data

(60) Provisional application No. 61/673,123, filed on Jul. 18, 2012.

(51) Int. Cl.
*G01C 3/08* (2006.01)
*H01S 3/094* (2006.01)
*H01S 3/067* (2006.01)
*H01S 3/0941* (2006.01)
*G01S 17/32* (2006.01)

(52) U.S. Cl.
CPC ........ *H01S 3/094003* (2013.01); *G01S 17/32* (2013.01); *H01S 3/06716* (2013.01); *H01S 3/06754* (2013.01); *H01S 3/0941* (2013.01)

(58) Field of Classification Search
CPC . G01C 3/08; H01S 3/094003; H01S 3/06716; H01S 3/06754; H01S 3/0941; G01S 17/32
See application file for complete search history.

(56) References Cited

U.S. PATENT DOCUMENTS

| | | | |
|---|---|---|---|
| 6,181,463 B1* | 1/2001 | Galvanauskas | B23K 26/0635 359/330 |
| 7,872,794 B1* | 1/2011 | Minelly | H01S 3/06758 359/337.13 |
| 2005/0200831 A1* | 9/2005 | Staley, III | F41G 3/065 356/4.01 |
| 2006/0209394 A1* | 9/2006 | Papernyi | H04B 10/291 359/341.33 |
| 2008/0030847 A1* | 2/2008 | Murison | H01S 3/06754 359/341.3 |
| 2008/0037597 A1* | 2/2008 | Mason | H01S 3/0602 372/13 |
| 2008/0039715 A1* | 2/2008 | Wilson | A61B 5/06 600/424 |
| 2009/0028193 A1* | 1/2009 | Islam | H01S 5/0064 372/6 |

(Continued)

*Primary Examiner* — Luke Ratcliffe
*Assistant Examiner* — Samantha K Abraham
(74) *Attorney, Agent, or Firm* — Kilpatrick Townsend & Stockton LLP

(57) ABSTRACT

Embodiments of the present invention are directed toward a low-power, high quality compact laser source. Embodiments include an optical combiner combining the outputs of a pump laser and a Fabry-Perot seed laser into a fiber amplifier. The fiber amplifier can comprise, for example, erbium-doped fiber. Embodiments can include pulsed and continuous wave lasers, depending on desired functionality.

20 Claims, 5 Drawing Sheets

(56) References Cited

U.S. PATENT DOCUMENTS

| | | | |
|---|---|---|---|
| 2009/0046746 A1* | 2/2009 | Munroe | H01S 3/06758 372/6 |
| 2010/0098125 A1* | 4/2010 | Bianchi | H01S 3/08 372/40 |
| 2010/0128744 A1* | 5/2010 | Deladurantaye | H01S 3/06754 372/6 |
| 2011/0122895 A1* | 5/2011 | Savage-Leuchs | H01S 3/06758 372/10 |
| 2011/0199621 A1* | 8/2011 | Robinson | G01S 17/89 356/628 |
| 2015/0176948 A1 | 6/2015 | Varshneya et al. | |
| 2015/0176949 A1 | 6/2015 | Varshneya et al. | |

* cited by examiner

COMPACT LASER SOURCE

CROSS-REFERENCE TO RELATED APPLICATIONS

This application claims priority to Provisional U.S. Patent Application No. 61/673,123 filed Jul. 18, 2012 by Maryfield et al. and entitled "CELLPHONE-SIZED 1.5 MICRON FIBER LASER SOURCE," of which the entire disclosure is hereby incorporated by reference for all purposes.

BACKGROUND

Some laser applications, such as range finding, utilize compact laser sources for laser pulse generation. Often, such compact laser sources can use architectures that can be expensive to manufacture. Laser sources utilizing, for example, a two-stage gain element, can include a grating, isolators, v-groove side pump, and other components that can be costly. Furthermore, laser sources often provide more power than necessary for certain applications, and can be burdensomely large and/or heavy.

BRIEF SUMMARY OF THE INVENTION

Embodiments of the present invention are directed toward a low-power, high quality compact laser source. Embodiments include an optical combiner combining the outputs of a pump laser and a Fabry-Perot seed laser into an optical fiber amplifier. The fiber amplifier can comprise, for example, erbium-doped fiber. Embodiments can include pulsed and continuous wave lasers, depending on desired functionality.

An example laser rangefinder unit, according to the description, includes comprising a body that houses a seed laser comprising a Fabry-Perot laser diode, a pump laser, an optical fiber amplifier, and an optical combiner coupled with the seed laser, the pump laser, and the optical fiber amplifier. The optical combiner is configured to combine an output of the seed laser and an output of the pump laser into the optical fiber amplifier. The laser rangefinder unit further includes an aperture coupled to the body and configured to form an output beam from an output of the optical fiber amplifier.

The laser rangefinder unit can include one or more of the following features. A diameter of the aperture can be between 10-15 mm. The optical fiber amplifier can include erbium-doped optical fiber. The erbium-doped optical fiber can include a single-mode fiber. The laser rangefinder unit can be configured to generate the output beam as a pulse of between 10-50 ns in duration. An output power corresponding to the pulse can be between 500-700 W. The laser rangefinder unit can be configured to generate a plurality of pulses having a duty cycle of 100-200 to 1. The laser rangefinder unit can be configured to generate the output beam as a continuous wavelength. An output power corresponding to the output beam can be between 0.75-1.25 W. The pump laser can output light with a wavelength of 940 nm.

An example laser source, according to the disclosure, can include a seed laser comprising a Fabry-Perot laser diode, a pump laser, and an optical fiber amplifier. The laser source can also include an optical combiner coupled with the seed laser, the pump laser, and the optical fiber amplifier. The optical combiner can be configured to combine an output of the seed laser and an output of the pump laser into the optical fiber amplifier.

The laser source can include one or more of the following features. The laser source can include a package configured to house at least one of, the seed laser, the pump laser, or the optical combiner. The package can include at least one of a butterfly package or a high heat load (HHL) package. The optical fiber amplifier can comprise erbium-doped optical fiber. The laser source can be configured to generate an output beam as a pulse of between 10-50 ns in duration. An output power corresponding to the pulse can be between 500-700 W. The laser source can be configured to generate a plurality of pulses having a duty cycle of 100-200 to 1. The laser source can be configured to generate an output beam as a continuous wavelength. An output power corresponding to the output beam can be between 0.75-1.25 W. The pump laser can output light with a wavelength of 940 nm.

Numerous benefits are achieved by way of the present invention over conventional techniques. For example, techniques utilized herein can provide for high-quality, low-power laser sources at considerably lower costs than many other custom solutions. Embodiments can further utilize single-mode fiber, which can help ensure a compact size. These and other embodiments of the invention, along with many of its advantages and features, are described in more detail in conjunction with the text below and attached figures.

DETAILED DESCRIPTION OF THE INVENTION

In the following description, for the purposes of explanation, numerous specific details are set forth in order to provide a thorough understanding of various embodiments of the present invention. It will be apparent, however, to one skilled in the art that embodiments of the present invention may be practiced without some of these specific details.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Embodiments of the present invention are directed toward a low-power, high quality laser source. Embodiments include an optical combiner combining the outputs of a pump laser and a Fabry-Perot (FP) seed laser into a fiber amplifier. Because of the components utilized, the laser source can be manufactured in relatively compact form factors in a cost-effective manner. Embodiments can be utilized in a variety of applications, including (but not limited to) laser imaging, range finding, and the like.

Figure 1:
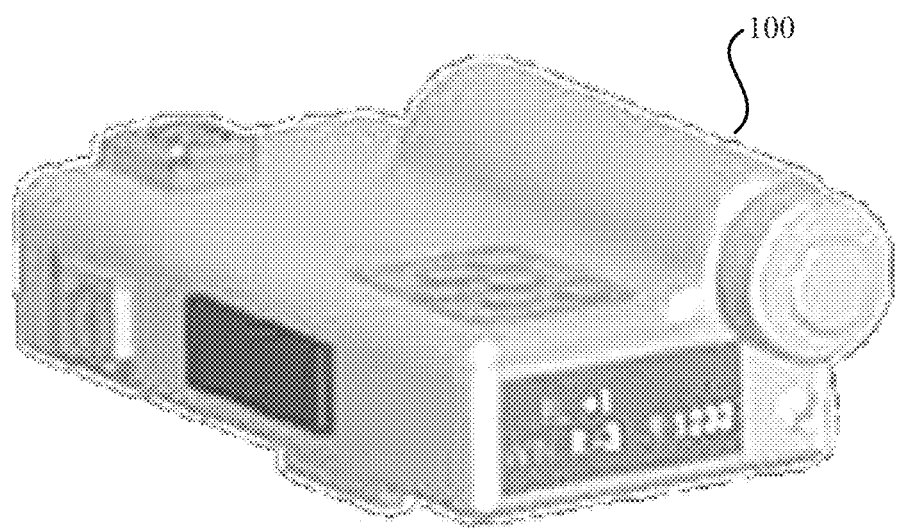
FIG. 1 is an illustration of an example range finding unit that integrates a compact laser source utilizing the components described herein, to provide range finding capabilities.

FIG. 1 is an illustration of a range finding unit 100 that integrates a compact laser source utilizing the components described herein below, to provide range finding capabilities. In this embodiment the compact laser source of the range finding unit 100 can be built using off-the-shelf components, making manufacture of the range finding unit 100 far cheaper than alternative options. And yet, components are still able to fit into a form factor roughly the size of a modern-day cell phone (e.g., 2-3"×3-5"×<1.5"). Some embodiments of the compact laser source, provided in further detail below, can utilize custom components to provide compact laser sources in much smaller form factors.

The size and shape of the range finding unit 100 may vary, depending on functionality. For example, an aperture of 30 mm may be utilized to generate a beam with a divergence of 100 μrad. However, certain applications, such as mid-range range finding, may be tolerant of larger divergence. This can provide for a smaller aperture (and a smaller footprint of the range finding unit 100 altogether). An aperture (e.g., aperture lens) with a diameter of between 10 and 15 mm, for example, can result in a beam divergence of 300 μrad, which may be acceptable in certain applications.

In addition to the optical components of the compact laser source (described in more detail below), some or all of which are housed in the body of the range finding unit 100, the range finding unit 100 can include additional components, such as electrical components, to provide additional functionality. For example, the range finding unit 100 may include a processing unit and/or other electrical hardware for controlling optical components (e.g., lasers), taking measurements, performing calculations, and/or communicating with one or more external devices. The range finding unit 100, may include an interface with which the range finding unit 100 can communicate with other devices. Moreover, the range finding unit 100 may have a user interface comprising a keypad, buttons, switches, display, touchpad, etc., enabling a user to configure settings of the range finding unit 100 and/or receive information from the range finding unit 100.

Figure 2A:
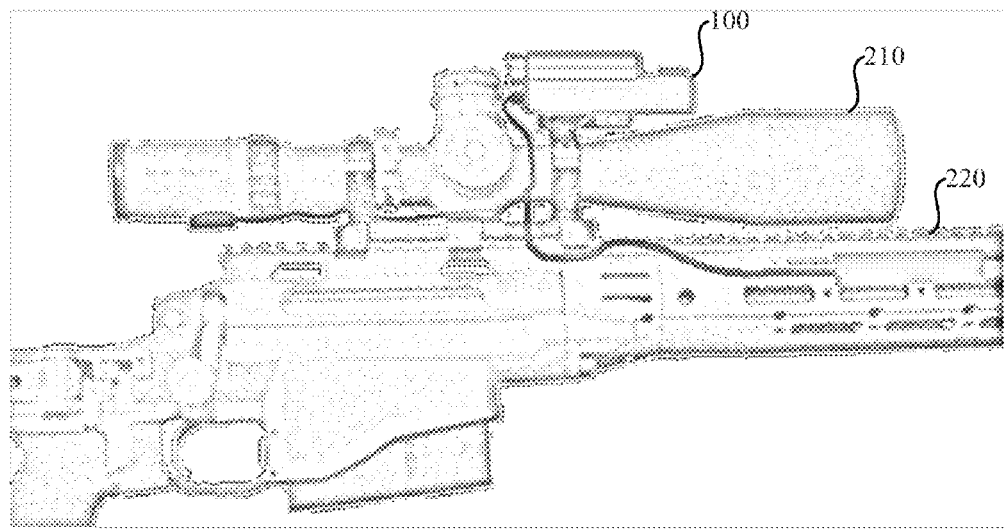
FIGS. 2A and 2B are illustrations of an application in which the range finding unit of FIG. 1 can be utilized in conjunction with a weapon-mounted sniper scope.
Figure 2B:
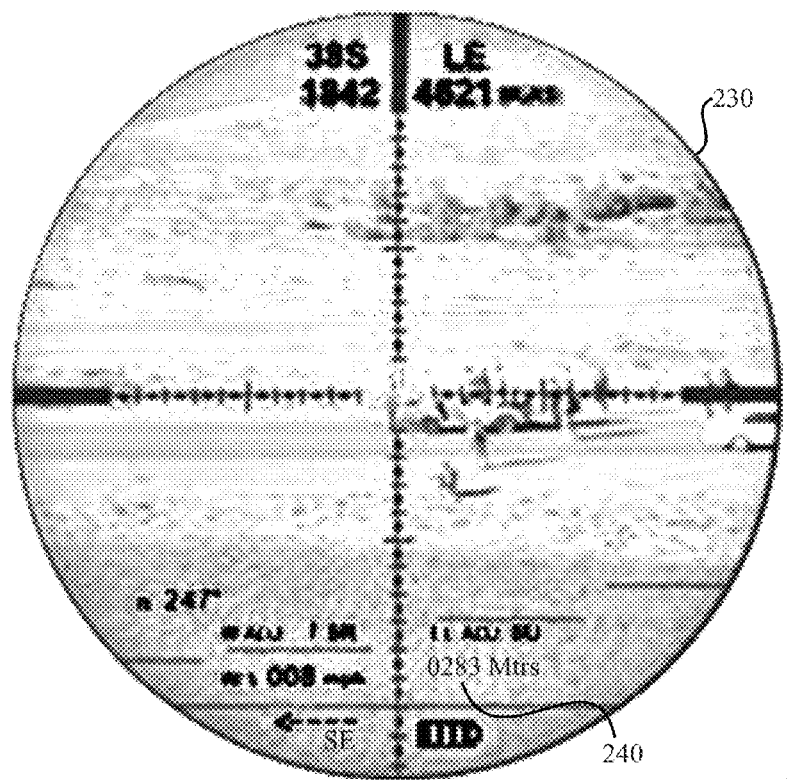

FIGS. 2A and 2B are illustrations of an application in which the range finding unit 100 of FIG. 1 is utilized in conjunction with a weapon-mounted sniper scope 210. In this application, as shown in FIG. 2A, the range finding unit 100 is coupled to a sniper scope 210, which is mounted on a weapon 220 (e.g., a sniper rifle). Of course, in other applications, the range finding unit 100 may be mounted to different types of scopes and/or weapons. In some embodiments, the range finding unit 100 (and/or other compact laser sources as described herein) can be integrated into a scope and/or weapon. A person of ordinary skill in the art will recognize many different applications and configurations.

The range finding unit 100 can be configured to communicate (e.g., electrically, optically, wirelessly, etc.) to the weapon 220 and/or sniper scope 210. This can enable the weapon and/or sniper scope to provide information obtained using the range finding unit 100 to a user (e.g., soldier). As illustrated in FIG. 2B, the sniper scope 210 can be configured to show a range 240 and/or other information its viewfinder 230. Depending on desired functionality, the range finding unit 100 can be configured to detect range and/or perform other functions enabled by the compact laser source integrated therein. Embodiments may further integrate other components to provide weather, elevation, spin drift, Coriolis effect, and/or other measurements and/or calculations. Information regarding these measurements and/or calculations can additionally or alternatively be provided in the viewfinder 230 of the sniper scope 210.

Figure 3:
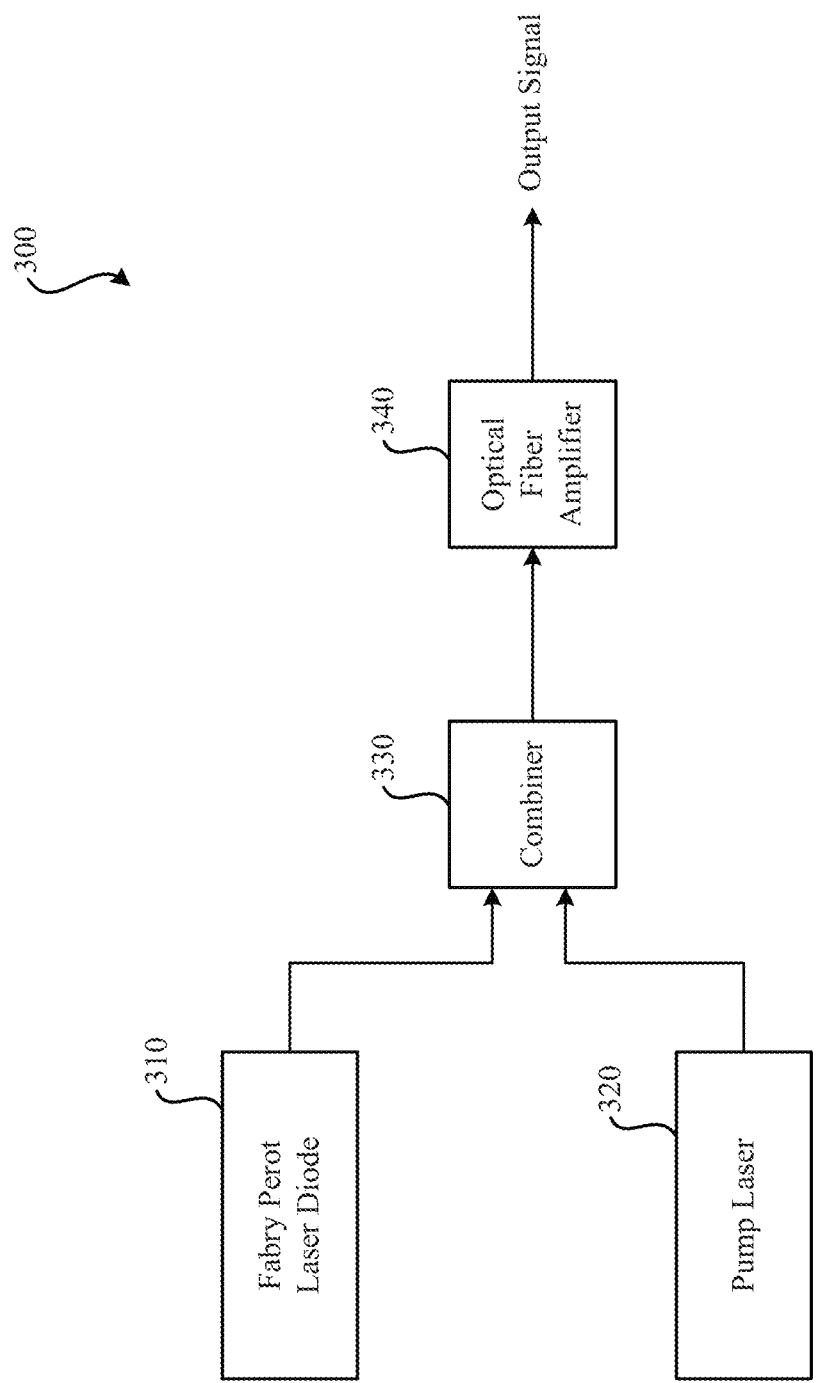
FIG. 3 is a block diagram of the components of a compact laser source, according to one embodiment.

In general, embodiments of the compact laser source 300 can utilize an FP laser diode as a pulsed and/or continuous wavelength (CW) seed source in a fiber Master Oscillator Power Amplifier (MOPA) system to generate an output laser signal. FIG. 3 is a block diagram of the components of a compact laser source 300, according to one embodiment. The compact laser source 300 can be utilized in a variety of applications, including the range finding unit 100 of FIG. 1, as discussed above.

Embodiments of the compact laser source 300 utilize an FP laser diode 310. Used naively, an FP laser diode 310 excited with a long intense electrical pulse (such as 50-100 ns) can yield optical pulses with tens of picoseconds modulation riding on its amplitude. When a FP laser diode 310 is strongly pulsed (e.g., using high currents), it can enter into a gain-switched mode. The cavity length of a FP diode is typically on the order of 1 mm, which can potentially lead to pulses which can be as short as 15-20 ps. If the coatings on the facets are sufficiently broadband (which is very common), the gain-switched diode has sufficient gain to lase over its full gain bandwidth, which is typically 10-15 nm. When any laser diode is energized using a pulse with a rise time faster than the carrier thermalization time, there is a change in the carrier density inside the laser cavity, which leads to a time-dependent change of the refractive index of the cavity, which in turn leads to a fast spectral chirp on the output of the laser diode. A combination of this phenomena leads to desirable behavior in an FP laser diode 310.

The spectrum of the FP laser diode 310 may not be smooth. Instead, the spectrum may be comb like, because of multiple cavity longitudinal modes being excited. However, both of these effects can be mitigated by taking the output of this laser diode and propagating it through an optical fiber amplifier 340 of the right amount of nonlinearity and the right amount of gain.

The nonlinearity of the optical fiber amplifier 340 can create four-wave mixing peaks in the optical spectrum. This can essentially "fill in" the gaps in the comb-like spectrum to make the spectrum smoother. In particular, stray feedback into the FP laser diode 310 can execute sidebands to each of the individual cavity modes, which are virtually invisible in most circumstances. The optical fiber amplifier 340 can pull up these sidebands and facilitate four-wave mixing between the sideband lines and the main longitudinal mode line. The optical fiber amplifier 340 when used in saturation regime can also remove picosecond-timescale modulation on top of the pulse.

Compared with traditional MOPA designs (which often utilize a distributed feedback (DFB) laser), the FP laser diode 310 has the advantage of higher peak power and average power. This is possible because of the broader spectral width of the FP laser diode 310, discussed above. This broader spectral width, as well as the longer pulse width of the laser range finding (and other applications), can be leveraged to make the FP laser diode 310 a better seed source than the DFB laser diode (which often has a line width of a tenth of a nanometer) for many applications. This is because the broader spectral width and the longer pulse width can more effectively "sweep out" the gain from the optical fiber amplifier 340 compared to a narrow-line width short-pulsed seed laser. Again, for the same two reasons of broader spectral width and wider pulse width, the peak powers are lowered, increasing the threshold of nonlinear parasitic processes (such as SBS, SRS, etc.) and damage in the fiber system.

The relatively wide line width of the FP laser diode 310 (and corresponding output signal of the compact laser source 300) can also be beneficial in laser imaging applications. For example, interference patterns (e.g., "speckle") due to the coherence of light in laser systems with relatively narrow line widths can reduce overall imaging quality. Because it utilizes an FP laser diode 310, however, the compact laser source 300 can provide higher quality imaging due to the reduced amount of coherency in the output laser signal which reduces an amount of image "speckling" from the constructive wave interference of coherent light.

The combiner 330 is an optical element configured to couple the outputs of the FP laser diode 310 and the pump laser to the optical fiber amplifier 340. Such coupling of the pump and seed energies can be employed by utilizing known fabrication and mass manufacturing techniques, and can include subcomponents such as circulators and/or other isolators. The compact size and manufacturability of these components may thereby facilitate the co-packaging any or all of these components, into standard packages such as the butterfly package and the high heat load (HHL) package.

Embodiments of the compact laser source 300 can utilize different components, based on desired functionality. In one embodiment, for example, an erbium-doped optical fiber amplifier is pumped with 940 nm wavelength light from the pump laser 320. The FP laser diode 310 provides seed energy at 1550 nm wavelengths to generate an output signal at 1550 nm wavelengths having 10-50 ns wide pulses at a duty cycle of 100-200 to 1, with a peak output power ranging from 500-700 W. In one specific example, a 20 ns-wide pulse can be generated at a frequency of 50 kHz. In other embodiments, a CW output signal of 1 W can be produced, within certain tolerances (e.g., ±5%, 10%, 20%, 25%, etc.) that may vary depending on application. Other embodiments may include wavelengths, duty cycles, and output powers that are greater or less than those provided in these embodiments. A person of ordinary skill in the art will recognize many variations.

Figure 4:
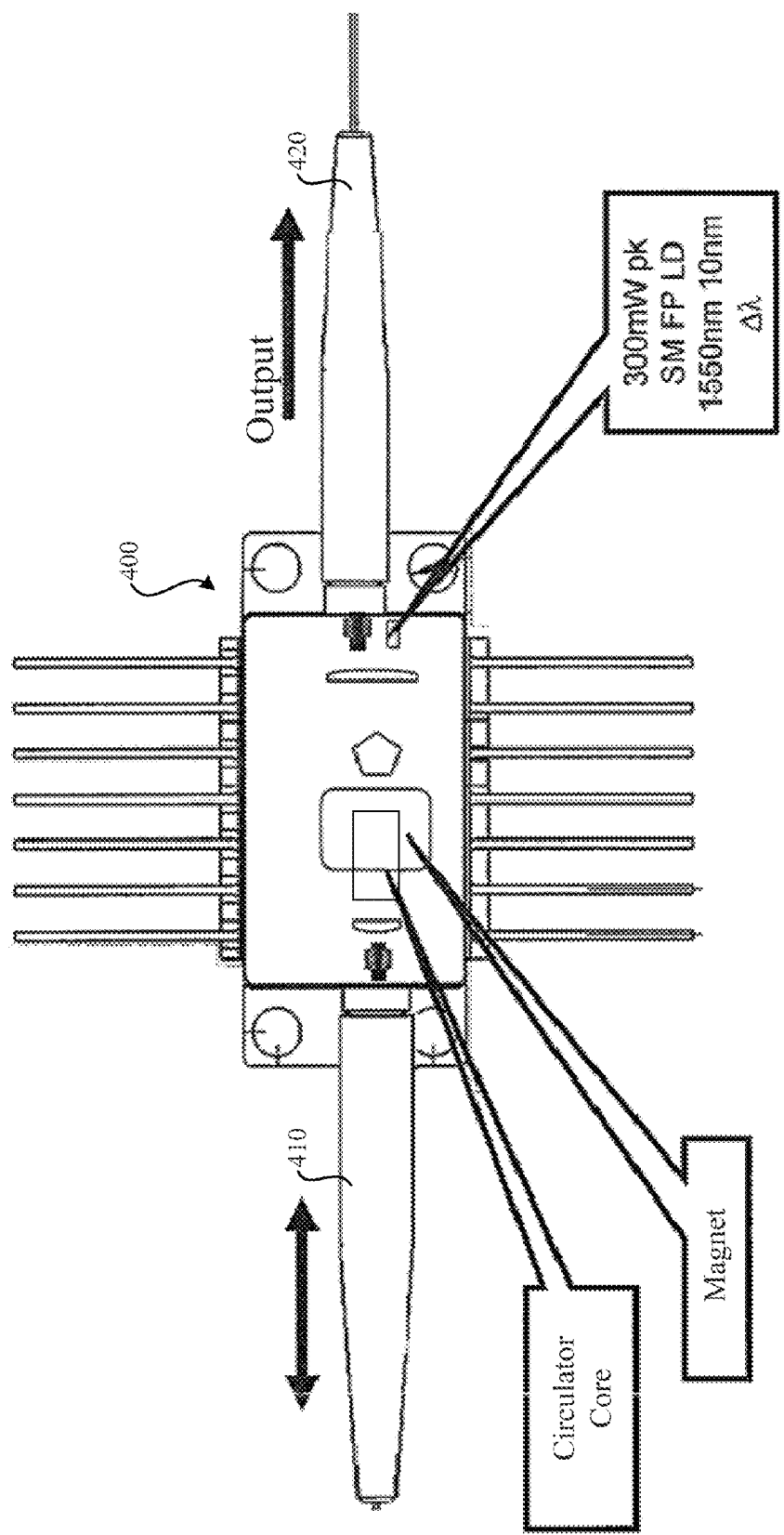
FIG. 4 is a diagram of components of a compact laser source implemented in a butterfly package, according to one embodiment.
Figure 5:
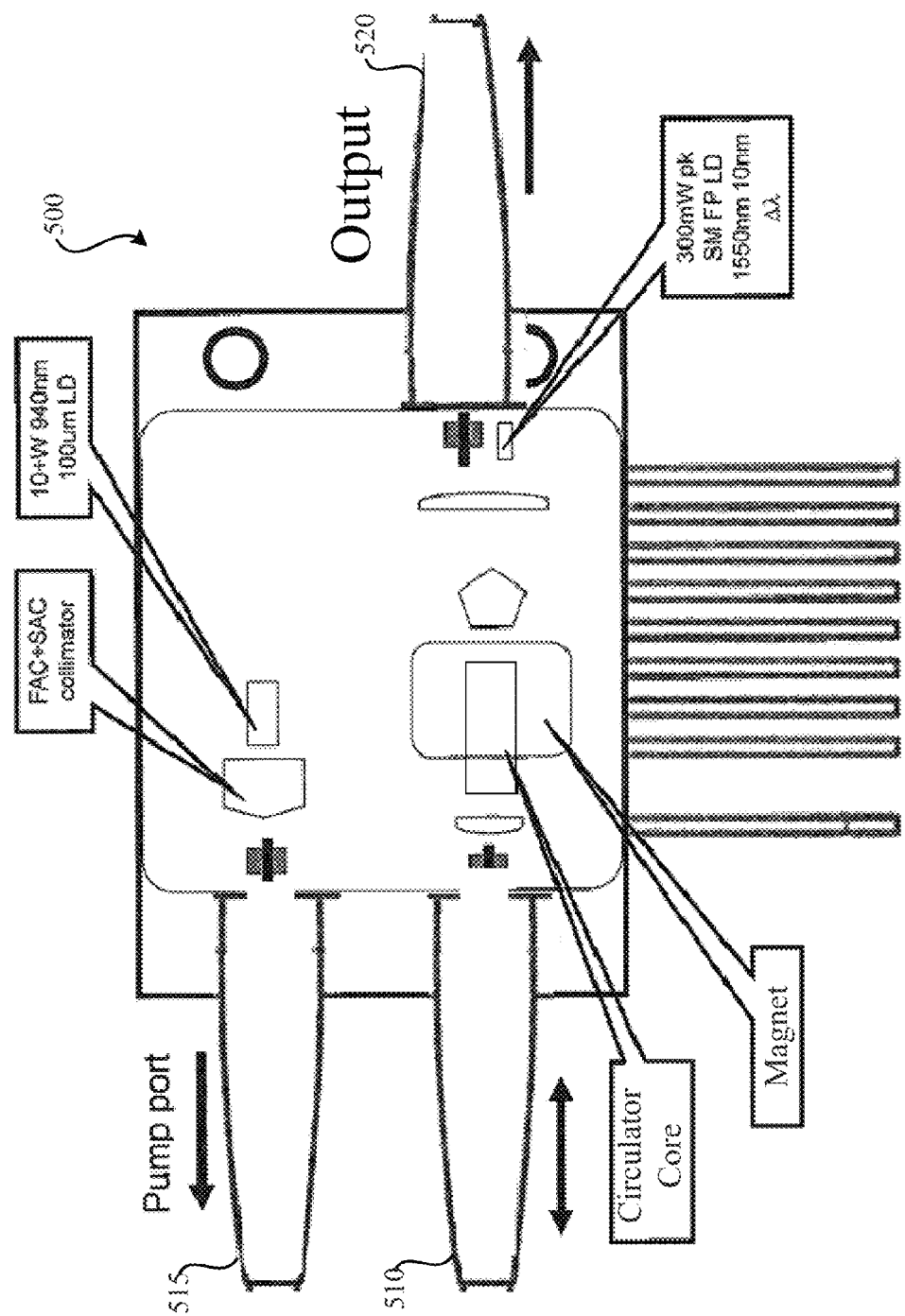
FIG. 5 is a diagram of components of a compact laser source implemented in an high heat load (HHL) package, according to one embodiment.

Although embodiments of a compact laser source 300 can provide for a small form factor that utilizes off-the-shelf components, even smaller form factors can be achieved when custom components are used. FIGS. 4 and 5 are diagrams of form factors in which components of the compact laser source 300 are included in compact packaging. Alternative embodiments may utilize additional and/or alternative components from those shown below, and/or may integrate additional components of the compact laser source 300, as illustrated in FIG. 3. Additionally, some embodiments contemplate other applications and functions, such as the use of a polarization-insensitive isolator, which can have a footprint of less than 30 mm. Furthermore, although single-mode fibers can facilitate smaller footprints, other types of optical fiber (e.g., multi-mode, large mode area (LMA), etc.) may additionally or alternatively be used.

FIG. 4 is a diagram of components of a compact laser source implemented in a butterfly package 400, according to one embodiment. As illustrated, the configuration can include a surface-mounted (SM) FP laser diode (LD) that generates a 1550 nm-wavelength seed with a line width of 10 nm. In this embodiment, single-clad fibers at the output 420 and input port 410 can be utilized with a core diameter of approximately 20 µm (±10%) and numerical aperture of 0.06 (±16.7%). A clad diameter of approximately 125 µm (±<2%) is also utilized. A circulator core is included to provide isolation from input received at input port 410. The input port 410 can receive a pump input, and seed and pump outputs can be provided at the output 420 of the butterfly package 400, which may then be fed to an optical amplifier, such as an optical fiber amplifier 340 discussed above in relation to FIG. 3. Additional features can be included, as illustrated, to perform functions known in the art such as couple light into and/or out of the package 400 and/or direct light to and/or from locations within the package 400.

FIG. 5 is a diagram of components of a compact laser source implemented in an HHL package 500, according to one embodiment. Similar to the components in FIG. 4, the configuration in FIG. 5 can include a surface-mounted FP laser diode that generates a 1550 nm-wavelength seed with a line width of 10 nm. Here, however, the package 500 also integrates a pump laser diode and a collimator to provide a pump output at the pump port 515. The pump laser diode can pump at 940 nm at 10 W or more. In this embodiment, similar to the package 400 of FIG. 4, single-clad fibers at the output 520 and input port 510 can be utilized with a core diameter of approximately 20 µm (±10%) and numerical aperture of 0.06 (±16.7%). A clad diameter of approximately 125 µm (±<2%) is also utilized. For a single-clad fiber at the pump port 515, the core diameter may be approximately 105 µm (±3%). A circulator core is included to provide isolation from input received at an input 410.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A device comprising:
   a rangefinder unit having a body that houses:
   a seed laser comprising a Fabry-Perot laser diode;
   a pump laser;
   an optical fiber amplifier; and
   an optical combiner coupled with the seed laser, the pump laser, and the optical fiber amplifier, the optical combiner configured to combine an output of the seed laser and an output of the pump laser into the optical fiber amplifier; and
   an aperture coupled to the body and configured to form an output beam from an output of the optical fiber amplifier;
   wherein a gain of the optical fiber amplifier is a function of a wavelength of an input signal of the optical fiber amplifier, and wherein the optical fiber amplifier is configured to create four-wave mixing peaks in a gain spectrum of the optical fiber amplifier, the gain spectrum relating the gain of the optical fiber amplifier to the wavelength of the input signal of the optical fiber amplifier.

2. The device as recited in claim 1, wherein a diameter of the aperture is between 10-15 mm.

3. The device as recited in claim 1, wherein the optical fiber amplifier comprises erbium-doped optical fiber.

4. The device as recited in claim 3, wherein the erbium-doped optical fiber comprises single-mode fiber.

5. The device as recited in claim 1, wherein the laser rangefinder unit is configured to generate the output beam as a pulse of between 10-50 ns in duration.

6. The device as recited in claim 5, wherein an output power corresponding to the pulse is between 500-700 W.

7. The device as recited in claim 5, wherein the laser rangefinder unit is configured to generate a plurality of pulses having a duty cycle of 100-200 to 1.

8. The device as recited in claim 1, wherein the laser rangefinder unit is configured to generate the output beam as a continuous wavelength.

9. The device as recited in claim 8, wherein an output power corresponding to the output beam is between 0.75-1.25 W.

10. The device as recited in claim 1, wherein the pump laser outputs light with a wavelength of 940 nm.

11. A laser source comprising:
a seed laser comprising a Fabry-Perot laser diode;
a pump laser;
an optical fiber amplifier; and
an optical combiner coupled with the seed laser, the pump laser, and the optical fiber amplifier, the optical combiner configured to combine an output of the seed laser and an output of the pump laser into the optical fiber amplifier,
wherein the seed laser, pump laser, optical fiber amplifier, and optical combiner are configured to enable the laser source to be housed in a rangefinder unit;
wherein a gain of the optical fiber amplifier is a function of a wavelength of an input signal of the optical fiber amplifier, and wherein the optical fiber amplifier is configured to create four-wave mixing peaks in a gain spectrum of the optical fiber amplifier, the gain spectrum relating the gain of the optical fiber amplifier to the wavelength of the input signal of the optical fiber amplifier.

12. The laser source as recited in claim 11, further comprising one or more packages configured to house at least one of, the seed laser, the pump laser, or the optical combiner.

13. The laser source as recited in claim 12, wherein the one or more packages comprise at least one of a butterfly package or a high heat load (HHL) package.

14. The laser source as recited in claim 11, wherein the optical fiber amplifier comprises erbium-doped optical fiber.

15. The laser source as recited in claim 11, wherein the laser source is configured to generate an output beam as a pulse of between 10-50 ns in duration.

16. The laser source as recited in claim 15, wherein an output power corresponding to the pulse is between 500-700 W.

17. The laser source as recited in claim 15, wherein the laser source is configured to generate a plurality of pulses having a duty cycle of 100-200 to 1.

18. The laser source as recited in claim 11, wherein the laser source is configured to generate an output beam as a continuous wavelength.

19. The laser source as recited in claim 18, wherein an output power corresponding to the output beam is between 0.75-1.25 W.

20. The laser source as recited in claim 11, wherein the pump laser outputs light with a wavelength of 940 nm.

* * * * *